United States Patent
Fox et al.

[11] Patent Number: 5,248,943
[45] Date of Patent: Sep. 28, 1993

[54] MULTI-VIEW COIL BANDPASS FILTER ARRAY SYSTEM

[75] Inventors: Timothy R. Fox, Chicago; Jerry C. Posluszny, Stickney, both of Ill.

[73] Assignee: Kabushiki Kaisha Toshiba, Kanagawa, Japan

[21] Appl. No.: 841,993

[22] Filed: Feb. 28, 1992

[51] Int. Cl.⁵ .............................. G01R 33/20
[52] U.S. Cl. ......................... 324/322; 324/312; 324/76.41
[58] Field of Search ............ 324/79 R, 79 D, 300, 324/307, 309, 310, 311, 312, 313, 318, 322

[56] References Cited

U.S. PATENT DOCUMENTS

| | | | |
|---|---|---|---|
| 3,674,998 | 7/1972 | Benz | 324/312 |
| 3,824,451 | 7/1974 | Freeman et al. | 324/312 |
| 4,689,563 | 8/1987 | Bottomley et al. | 324/309 |
| 4,703,273 | 10/1987 | Kolbe et al. | 324/314 |

*Primary Examiner*—Michael J. Tokar
*Attorney, Agent, or Firm*—Finnegan, Henderson, Farabow, Garrett & Dunner

[57] ABSTRACT

An MRI signal processing apparatus is disclosed which provides a low noise output signal for use in a multi-coil MRI system, wherein each sensing coil provides an input signal to the MRI signal processing apparatus. The apparatus includes input mixer circuitry for frequency shifting each input channel from a first frequency range to a second frequency range, controllable bandpass filter circuity connected to the input mixer circuitry for bandpass filtering each frequency shifted input channel to remove unwanted noise from the MRI signal, output mixer circuity for frequency shifting the output of the controllable bandpass filter circuitry from the second frequency range to the first frequency range, summing circuitry for combining the outputs of the output mixer circuitry of each channel to produce the low noise output signal, mixer control circuitry for controlling the frequency shift of the input mixer circuitry and the output mixer circuitry, and filter control circuitry for controlling the bandwidth and phase shift characteristics of the controllable bandpass filter circuitry.

29 Claims, 8 Drawing Sheets

MULTI-VIEW COIL BANDPASS FILTER ARRAY SYSTEM

BACKGROUND OF THE INVENTION

1. Field of the Invention

The present invention relates to a signal processing apparatus and method for use in a magnetic resonance imaging (MRI) system, and more particularly to such an apparatus and method which increases the signal to noise ratio of an MRI signal.

2. Discussion of the Related Art

As is well known, MRI signals are generated when an object to be imaged is located in a magnetic field. The magnetic field causes the magnetic dipole moment of each proton (or other nucleus) in the object to precess at a specific frequency, often called the Larmor frequency. The Larmor frequency of a specific proton in the object is proportional to the local strength of the magnetic field at the position of that proton.

Conventional MRI devices establish magnetic fields that vary with respect to location and time. Therefore, information regarding various locations within the object to be imaged can be associated with a known frequency or range of frequencies and with a known time or period of time.

Conventionally, MRI devices are known that use multi-coil sensing systems to sense the MRI signal induced by the precessing nuclei. For example, multi-coil systems include two or more coils arranged in a specific spatial relationship to provide good signal strength for a desired imaging application. Commonly, several coils are provided in a planar relationship for use in sagittal scanning of the human back.

When using a multi-coil system, a magnetic field gradient can be established such that each coil of the system may be generally associated with a given frequency range. Adjacent coils usually have adjacent frequency ranges. For example, in a sagittal scanning system, a magnetic field may be generated that is weak at the base of the spine of the person being imaged and that increases in strength towards the head of the person. Often, a constant magnetic field gradient is used which creates a frequency gradient, expressed in hertz per centimeter, in the area in which the object to be examined is located.

Therefore, in a sagittal scan of the human back, for example, each section of the back may be generally associated with a given frequency range, and the imaging signal information along the length of the back ca be received by the multi-coil system. However, due to the nature of the coil responses as a function of position of the precessing protons (or nuclei), it should be understood that some overlap between the frequency sensitivities of the various coils in the multi-coil system will exist.

In conventional multi-coil systems, the output from each coil is summed to produce an output signal which includes image information for the entire imaging field. A drawback in this conventional summing technique is that noise generated by each coil in the multi-coil system is also summed. Therefore, the signal output from the summing device includes a high level of noise and the image quality is accordingly degraded.

A source of this noise is "Johnson noise," which is the noise created when an electrical circuit includes a resistive component, at temperatures above absolute zero. For example, when imaging human tissue, small induced currents are often generated within the slightly conductive human tissue by the time varying magnetic fields induced by the current through the MRI sensing coil. Thermal agitation of electrons in these resistive paths generates random voltage fluctuations (i.e. Johnson noise) that degrade the MRI signal. Johnson noise is broadband and theoretically exhibits a flat spectrum of noise power per unit bandwidth, as a function of frequency.

II. SUMMARY OF THE INVENTION

An object of the invention is to provide an apparatus and method which provide a low noise MRI signal from a multi-coil sensing system which allows high resolution images to be produced.

A further object of the invention is to provide an apparatus which may be easily controlled over different viewing ranges and which can be easily adjusted to process MRI signals in varying frequency ranges.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention provides an MRI signal processing apparatus for providing a low noise output signal including a plurality of input channels for receiving a plurality of MRI signals, each MRI signal originating from a sensing coil which produces an MRI signal in a first frequency range, comprising input mixer means for frequency shifting each of the plurality of MRI signal from the first frequency range to a second frequency range, controllable bandpass filter means coupled to the input mixer means for bandpass filtering each of the plurality of frequency shifted MRI signals, output mixer means for frequency shifting each MRI signal output from the controllable bandpass filter means from the second frequency range to the first frequency range, summing means for combining the frequency shifted signals output from the output mixer means to produce the low noise output signal, mixer control means for controlling the respective frequency shifts of the input mixer means and the output mixer means, and filter control means for controlling bandwidth and phase shift characteristics of the controllable bandpass filter means.

In another embodiment, the invention provides an MRI signal processing apparatus for providing a low noise output signal including a plurality of input channels for receiving a plurality of MRI signals, each MRI signal originating from a sensing coil, comprising quadrature bandpass filter means for bandpass filtering each MRI signal to remove unwanted noise from the MRI signal, the quadrature bandpass filter means including a plurality of quadrature bandpass filters, each filter including a pair of input signal mixers for down mixing the MRI signal to a baseband frequency range, a pair of controllable lowpass filters coupled to the pair of input signal mixers, a pair of output signal mixers for up mixing a signal from a baseband frequency range to a frequency range of the MRI signal inputted to the pair of input signal mixers, summing means for combining the filtered MRI signals outputted by the quadrature bandpass filter means to produce the low noise output signal, and filter control means for controlling bandwidth and phase shift characteristics of the quadrature bandpass filter means, the filter control means including local oscillator means for generating a single frequency signal and phase network means for producing a plurality of phase shifted output signals from the single frequency signal to control the phase shift of the quadrature bandpass filters.

In yet another embodiment, the invention provides a method for processing a plurality of MRI signals to provide a low noise output signal including a plurality of input channels for receiving the plurality of MRI signals, each MRI signal originating from a sensing coil which produces the MRI signal in a first frequency range, comprising the steps of frequency shifting each of the plurality of MRI signals from the first frequency range to a second frequency range, bandpass filtering each frequency shifted MRI signal to remove unwanted noise from the MRI signal, frequency shifting each bandpass filtered MRI signal from the second frequency range to the first frequency range, and combining the MRI signals frequency shifted to the first frequency range to produce the low noise output signal.

In still another embodiment, the invention provides a method for processing a plurality of MRI signals to provide a low noise output signal including a plurality of input channels, each input channel originating from a sensing coil which produces an MRI signal, comprising the steps of bandpass filtering each of the plurality of MRI signal to remove unwanted noise from the MRI signal, the bandpass filtering step including the substeps of down mixing each MRI signal to a baseband frequency range to produce first and second signals in phase quadrature, lowpass filtering the first and second signals to remove unwanted noise therefrom, and up mixing and recombining the lowpass filtered first and second signals to produce a filtered signal, and combining the plurality of filtered signals to produce the low noise output signal.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

IV. DETAILED DESCRIPTION OF THE PREFERRED EMBODIMENTS

Reference will now be made in detail to the present preferred embodiments of the invention, examples of which are illustrated in the accompanying drawings. Whenever possible, the same reference numbers will be used throughout the drawings to refer to the same or like parts.

Figure 1:
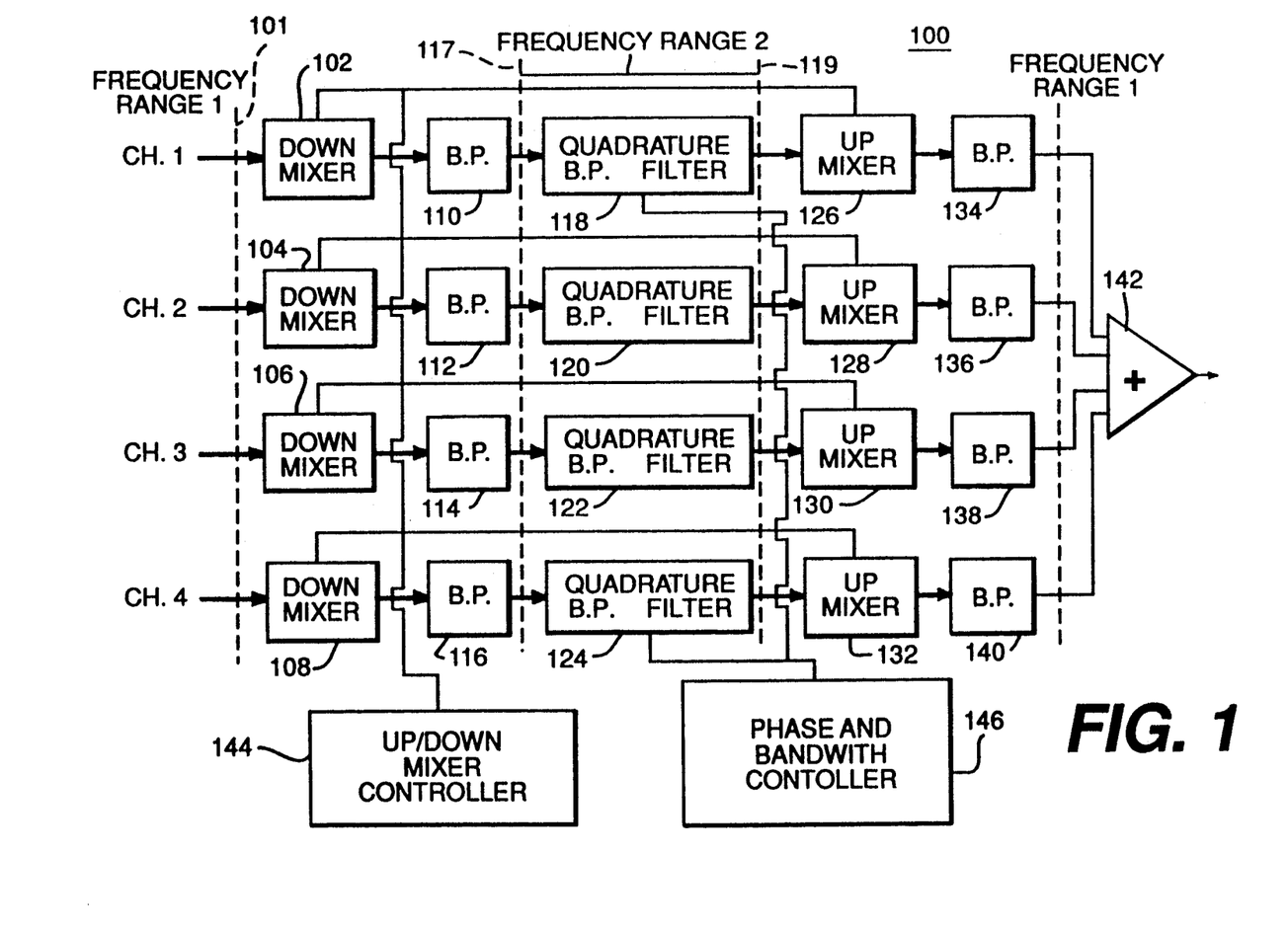
FIG. 1 is a block diagram of an embodiment of apparatus constructed according to the present invention.

The present invention relates to an MRI signal processing apparatus for providing a low noise output signal including a plurality of input channels, each input originating from a sensing coil which produces an MRI signal in a first frequency range. FIG. 1 illustrates exemplary MRI signal processing apparatus 100 which may be used with four sensing coils, the output from each sensing coil being input into the apparatus at respective channels 1-4. Generally, each signal path may be referred to as a channel (the signal path from a down mixer 102 to a bandpass filter 134 may be considered a channel, for example). Of course, any number of channels could be considered.

A vertical dashed line 101 across these four input channels indicates that these signals are in a first frequency range. In the preferred embodiment, this first frequency range corresponds to about 21-22 MHz.

The apparatus of the preferred embodiment of the present invention includes input mixer means for frequency shifting each MRI signal from the first frequency range to a second frequency range. As shown in FIG. 1, such input mixer means is provided in each of channels 1-4 as a down mixer and bandpass filter pair, 102 and 110, 104 and 112, 106 and 114, and 108 and 116, respectively. As shown in FIG. 1, the input mixer means shifts the frequency of each of the channels 1-4 from frequency range 1, indicated by dashed line 101, to frequency range 2, indicated by a dashed line 117 in FIG. 1. A preferred frequency range 2 is about 13.4 MHz.

In accordance with the preferred embodiment, the input mixer means comprises bandpass filter means for passing a wide range of frequencies, first buffer amplifier means connected to the bandpass filter means, signal mixer means for mixing a signal from the first buffer amplifier means with a signal from a mixer control means, and second buffer amplifier means connected to the output of the signal mixer means.

Figure 2:
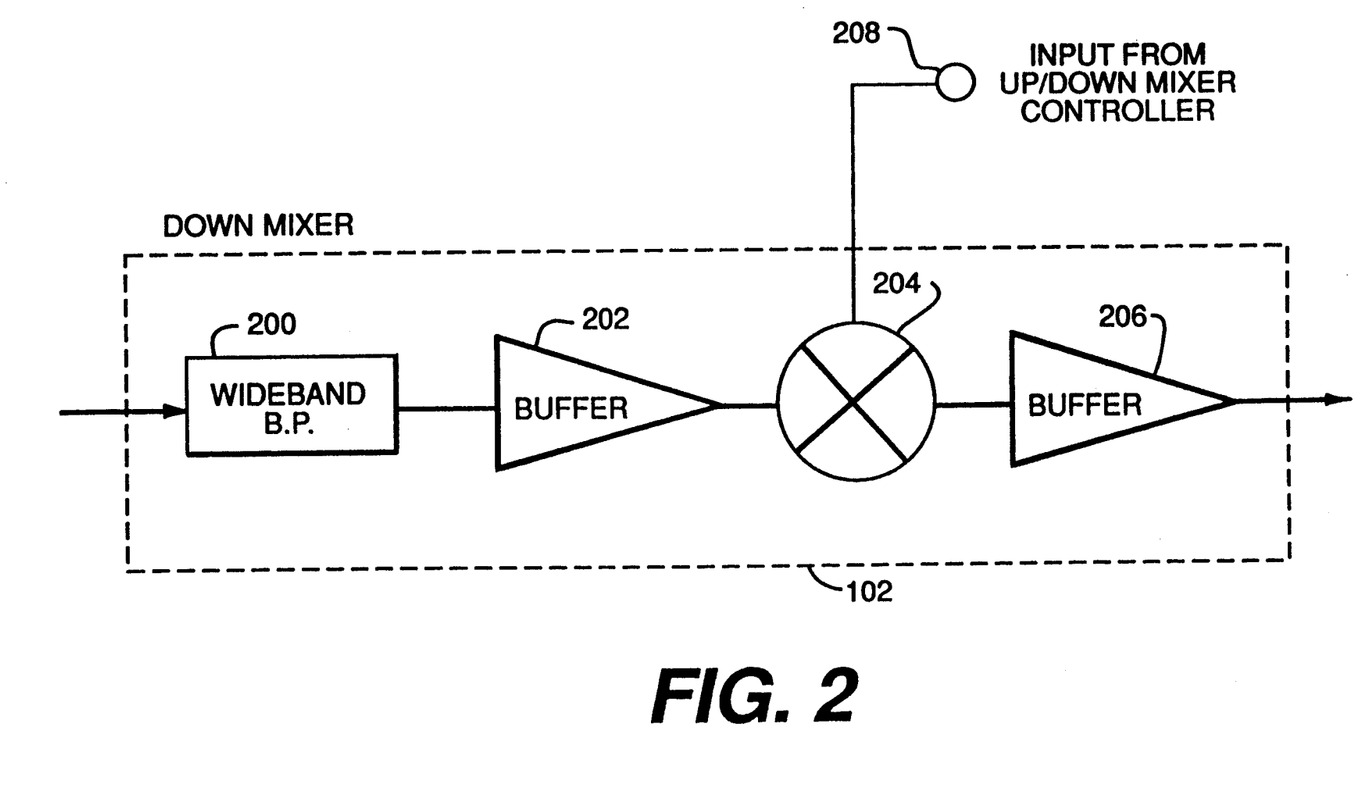
FIG. 2 is a block diagram of a down mixer shown in FIG. 1.

FIG. 2 illustrates a preferred construction of down mixer 102, it being understood that down mixers 104, 106, and 108 each have the same construction. With reference to FIG. 2, down mixer 102 comprises a wideband bandpass filter 200 which preferably has a passband of 3 MHz. The wideband bandpass filter 200 is connected to a buffer amplifier 202. The buffer amplifier 202 is connected to a signal mixer 204, such as a heterodyne mixer, which multiplies the output of the buffer amplifier 202 with an input from an up/down mixer controller 208, discussed later. The signal mixer 204 performs the actual frequency shifting operation. A buffer 206 receives the output from the signal mixer 204 and produces the output of the down mixer 102.

In general, signal mixers, such as the signal mixer 204, produce a real time product of the two input signals, each having a frequency range of F1 and F2. The signal mixer typically outputs two signals in different frequency ranges. A sum signal is generated at a frequency range of F1+F2, and a difference signal will be generated at a frequency range of |F1−F2|.

Because each of the down mixers 102, 104, 106, and 108 produces both sum and difference signals, bandpass filters 110, 112, 114, and 116 are respectively provided for each of the channels 1-4 to remove the unwanted frequency components, as shown in FIG. 1. In the preferred embodiment, the difference signal is the desired signal and the bandpass filters 110, 112, 114, and 116 are designed to block the sum signal.

The apparatus of the preferred embodiment also includes controllable bandpass filter means comprising a plurality of quadrature bandpass filters, each quadrature bandpass filter receiving a signal which originated from a sensing coil. Furthermore, each quadrature bandpass filter comprises a pair of input signal mixers for down mixing an input signal to a baseband frequency range, a pair of controllable lowpass filters connected to the pair of input signal mixers, and a pair of output signal mixers for up mixing a signal from a baseband frequency range to the frequency of the input signal inputted to the pair of input signal mixers.

As shown in FIG. 1, such controllable bandpass filter means are provided as quadrature bandpass filters 118, 120, 122, and 124 which are connected to receive the MRI signals output from the bandpass filters 110, 112, 114, and 116, respectively. As indicated by the dashed lines 117 and 119 in FIG. 1, the MRI signals input to and output by the quadrature bandpass filters 118, 120, 122, and 124 are within frequency range 2.

The quadrature bandpass filters 118, 120, 122, and 124 selectively pass the desired MRI signals in frequency range 2 and block signals outside that frequency range. In particular, the quadrature bandpass filters 118, 120, 122, and 124 reduce the signal power from broadband Johnson noise outside frequency range 2 in the MRI sensing coil circuit to thereby significantly improve the overall signal to noise ratio of the apparatus.

By way of explanation, to receive the total MRI signal from the plurality of sensing coils in a multi-coil system, an MRI receiver (not shown) should have a bandwidth greater than the frequency range of the total signal. The output of each sensing coil usually contains signal power over a smaller range of frequencies, but contains noise power, such as created by the broadband "Johnson noise," over a wide range of frequencies larger than the rang of the signal. The total noise in the system is therefore a function of the bandwidth of the MRI receiver system (not shown).

When broadband noise ("white" noise) is applied to the input of a bandpass filter, the noise power at the filter output is proportional to the bandwidth (i.e., the noise voltage at the filter output is proportional to the square root of the bandwidth). If the bandwidth of each channel is reduced to a value sufficient to pass most of the signal power from that channel, but less than the total receiver bandwidth, the total signal will suffer only small changes and the total noise power will be desirably reduced. For example, if the separation between channel center frequencies is 10 KHz and the signal in each channel includes MRI information in a bandwidth of 15 KHz, then four such channels require a receiver bandwidth of at least 45 KHz to include the signal power from all four overlapping channels. In this case, reducing each channel's bandwidth from the full 45 KHz to 15 KHz would reduce the total noise power at the output by a factor of 3 (assuming no correlation between noise signals), with negligible change in the signal power. Therefore, the signal to noise ratio would improve by 4.77 dB, i.e., a factor of 3 in power, or a factor of $\sqrt{3}$ in voltage.

The quadrature bandpass filters 118, 120, 122, and 124 are preferably constructed so that the bandwidth and center frequency thereof are controllable. Therefore, in the preferred embodiment, the center frequency of each quadrature bandpass filter 118, 120, 122, and 124 can be set to the frequency corresponding to the center of each respective coil response in the multi-coil system. Similarly, the bandwidth of each quadrature bandpass filter 118, 120, 122, and 124 can be set to pass at least the frequencies corresponding to the adjacent edges of each coil response.

Also, the quadrature bandpass filters 118, 120, 122, and 124 each have a filter characteristic that advantageously has arithmetic symmetry about the filter's center frequency. In other words, each of the quadrature bandpass filters 118, 120, 122, and 124 satisfies the equation:

$$|H(f_o + \Delta f)| = |H(f_o - \Delta f)|$$

where H is the power response of the filter, $f_o$ is the center frequency of the filter characteristic, and $\Delta f$ is an incremental frequency unit.

In contrast, other types of bandpass filters may only provide geometric symmetry about the center frequency. Geometric symmetry is provided by filters that satisfy the equation:

$$|H(f_o \times k)| = |H(f_o + k)|$$

where H is the power response of the filter, $f_o$ is the center frequency of the filter characteristic, and k is a constant value.

Figure 3:
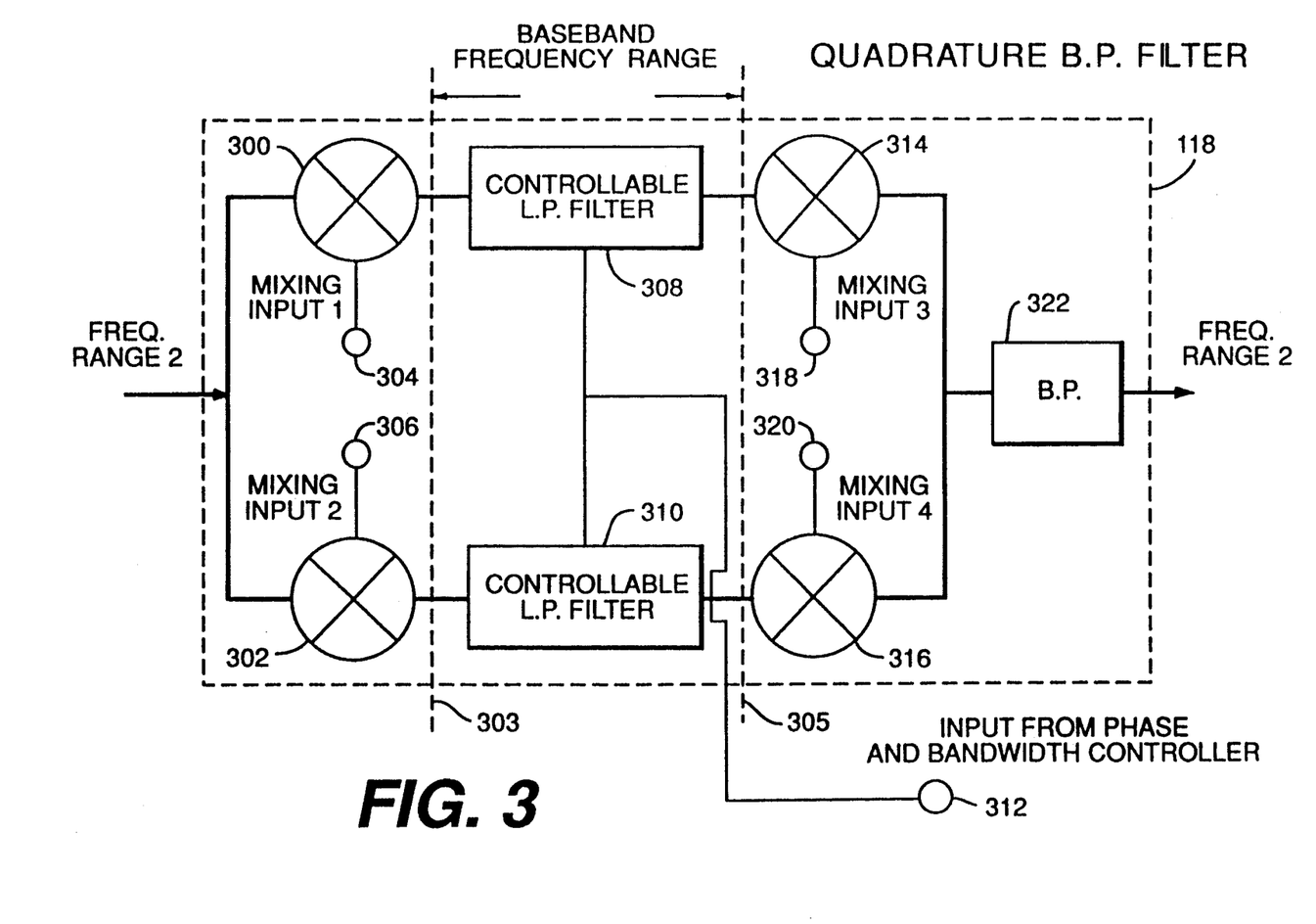
FIG. 3 is a block diagram of a quadrature bandpass filter shown in FIG. 1.

FIG. 3 illustrates a preferred construction of the quadrature bandpass filter 118, it being understood that the filters 120, 122, and 124 each have the same construction. With reference to FIG. 3, an MRI signal in frequency range 2 is input to a pair of signal mixers 300 and 302. As indicated by the dotted lines 303 and 305 in FIG. 3, the output from this pair of signal mixers 300 and 302 is in a baseband frequency range. Baseband frequency range generally refers to a frequency range centered about zero frequency. Signal mixer 300 receives a first mixing input through a terminal 304 and signal mixer 302 receives a second mixing input through a terminal 306. As explained hereinafter, the first mixing input and the second mixing input are provided by a phase and bandwidth controller 146, shown in FIG. 1.

The output from the pair of signal mixers 300 and 302 is provided to a pair of controllable lowpass filters 308 and 310. As is well known in regard to quadrature bandpass filtering, two channels in phase quadrature may be used to distinguish between positive and negative frequencies in a baseband frequency range. The system in FIG. 3 produces a arithmetically-symmetric bandpass filter function if: mixing inputs 1, 2, 3, and 4 are all at the center frequency of the bandpass filter; mixing inputs 1 and 2 are in phase quadrature with respect to each other; mixing inputs 3 and 4 are in phase quadrature with each other; the gain through the combination of mixer 300, filter 308, and mixer 314 equals the gain through the combination of mixer 302, filter 310, and mixer 316; and the phase shift through the combination of mixer 300, filter 308, and mixer 314 equals the phase shift through the combination of mixer 302, filter 310, and mixer 316.

The controllable lowpass filters 308 and 310 are controlled by an input from the phase and bandwidth controller 146 through a terminal 312. In the preferred embodiment, each controllable lowpass filter 308 and 310 includes a switched capacitor lowpass filter in which the upper cutoff frequency can be controlled by varying a single frequency input signal. Most preferably, the lowpass filters 308 and 310 have matched gains and a low D.C. offset. An example of a preferred lowpass filter is described in U.S. patent application Ser. No. 07/830,571, filed Feb. 5, 1992, by T. R. Fox, a coinventor of the present application.

The MRI signals output from the pair of controllable lowpass filters 308 and 310 are at the baseband frequency range as shown by the dotted line 305 in FIG. 3 and are input to a pair of output signal mixers 314 and 316. Signal mixer 314 receives a third mixing input through a terminal 318 and signal mixer 316 receives a fourth mixing input through a terminal 320. The pair of signal mixers 314 and 316 frequency shift the MRI signals output from the pair of controllable lowpass filters 308 and 310 from baseband to the second frequency range.

In accordance with the preferred embodiment of the invention, each quadrature bandpass filter further comprises a bandpass filter connected to the pair of output signal mixers for removing unwanted frequencies in the signal from the output signal mixers. As embodied herein, a bandpass filter 322 is connected to the output signal mixers 314 and 316.

As explained previously, signal mixers in general generate sum and difference signals. Therefore, bandpass filter 322 may be used to remove the undesired frequency components. Accordingly, the output from bandpass filter 322 is in the desired frequency range 2.

Figure 4:
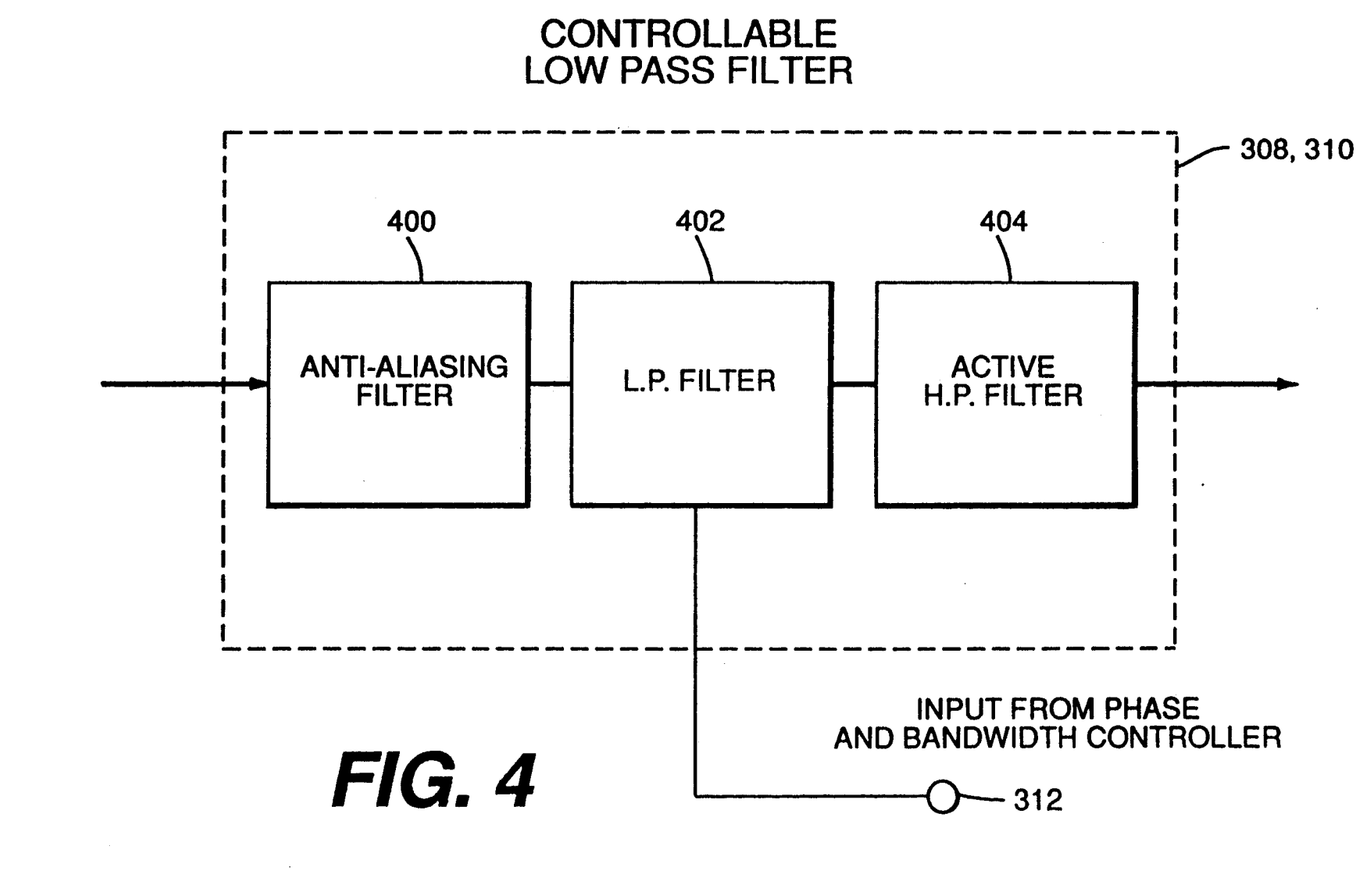
FIG. 4 is a block diagram of a controllable lowpass filter shown in FIG. 1.

In accordance with the preferred embodiment of the invention the controllable lowpass filter preferably comprises an anti-aliasing filter, a lowpass filter, and an active high pass filter. FIG. 4 illustrates controllable lowpass filter 308, it being understood that filter 310 has the same construction. With reference to FIG. 4, controllable lowpass filter 308 includes an anti-aliasing filter 400 which receives the input signal. The anti-aliasing filter 400 is connected to a lowpass filter 402 which receives a control signal from the phase and bandwidth controller 146 through the terminal 312, as previously described. Connected to the output of the lowpass filter 402 is an active highpass filter 406 for removing any D.C. offset in the MRI signal that may degrade the signal quality.

Due to the discrete time nature of the preferred switched capacitor lowpass filter 402, the anti-aliasing filter 400 is necessary to suppress the frequency domain replicas caused by the aliasing phenomenon due to the sampling rate of the filter. The active highpass filter is used to remove any unwanted D.C. offset voltage produced by the mixers, lowpass filters, and associated amplifiers before the highpass filter.

The preferred embodiment of the present invention further includes output mixer means for frequency shifting the MRI signal output from the controllable bandpass filter means from the second frequency range to the first frequency range. As shown in FIG. 1, the output mixer means is provided as up mixers 126, 128, 130, and 132 connected to receive the low noise signals output from the quadrature bandpass filters 118, 120, 122, and 124 in frequency range 2, respectively.

In the preferred embodiment, each up mixer includes a signal mixer (not shown), as previously discussed. Because each signal mixer generates a sum and difference signal, bandpass filters 134, 136, 138, and 140 are provided to remove the unwanted frequency components. In the preferred embodiment, the desired frequency components are those resulting from the summing operation of each up mixer and the bandpass filters 134, 136, 138, and 140 are designed to pass frequencies in frequency range 1 and reject the difference frequencies.

The preferred embodiment of the present invention additionally includes summing means for combining the output of the output mixer means to produce the low noise output signal. As shown in the summing means provided in FIG. 1, a summer 142 is connected to receive the outputs of bandpass filters 134, 136, 138, and 140. The summer 142 produces the low noise output signal of signal processing apparatus 100.

The preferred embodiment of the present invention also includes mixer control means for controlling the frequency shift of the input mixer means and the output mixer means. As shown in FIG. 1, the mixer control means is provided as an up/down mixer controller 144 which is connected to each down mixer 102, 104, 106, and 108 and each up mixer 126, 128, 130, and 132.

Figures 5A, 5B:
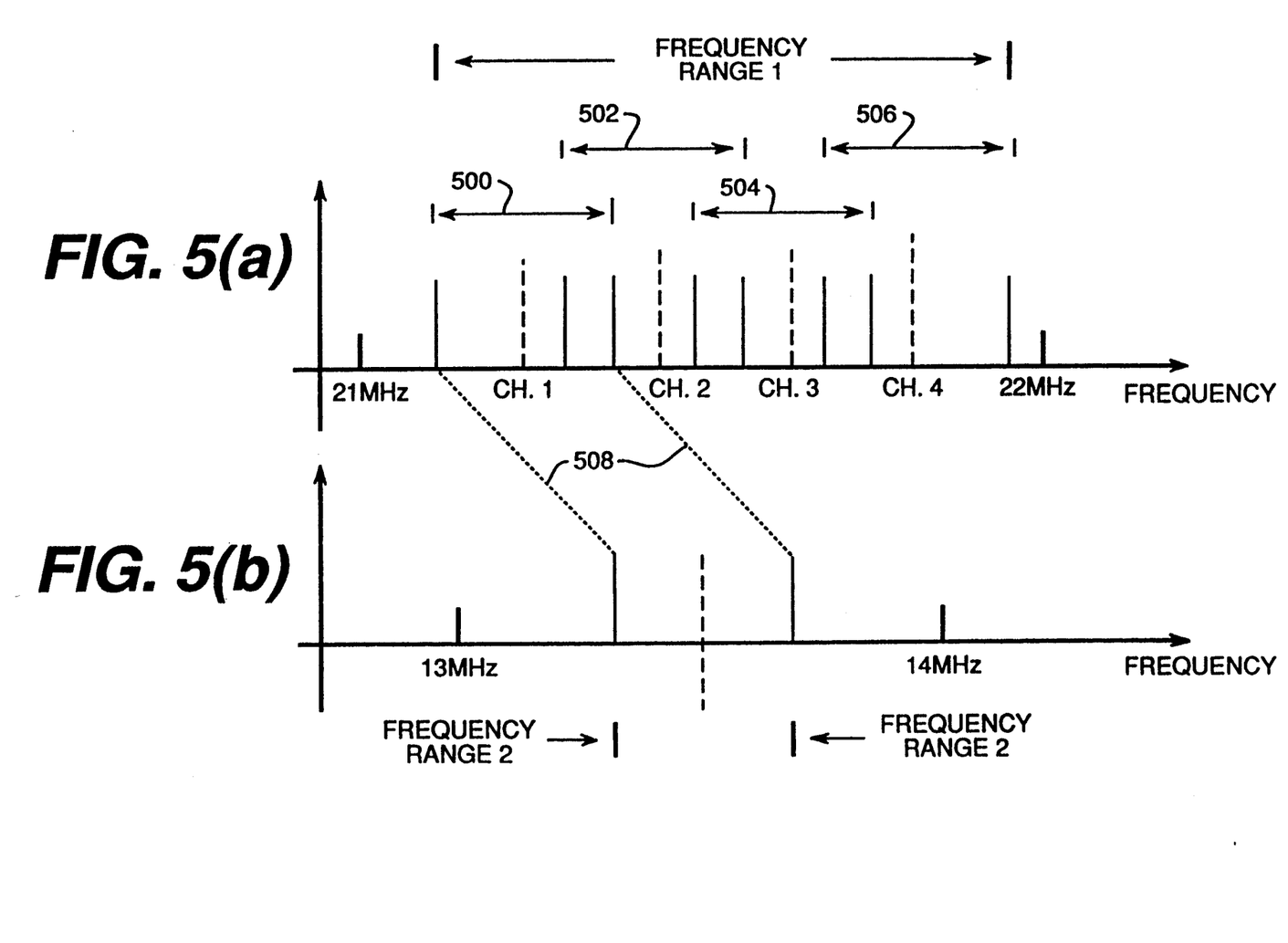
FIG. 5(a) is a graph of the frequency distribution of channels 1-4 in frequency range 1 shown in FIG. 1.
FIG. 5(b) is a graph of the frequency distribution of frequency range 2 shown in FIGS. 1 and 3.

FIGS. 5(a) and 5(b) respectively illustrate a frequency domain representation of the preferred frequency range 1 and frequency range 2 used in the present invention. In FIG. 5(a), a preferred frequency range 1 is shown between 21-22 MHz. Within this frequency range, the MRI signals of channel 1-4 occupy various adjacent sub-frequency ranges. Channel 1 occupies the sub-frequency range indicated by arrow 500, channel 2 occupies the sub-frequency range indicated by arrow 502, channel 3 occupies the sub-frequency range indicated by arrow 504, and channel 4 occupies the sub-frequency range indicated by arrow 506, for example. As can be seen from FIG. 5(a), the adjacent sub-frequency ranges overlap somewhat due to the sensitivity characteristics of each coil in the multi-coil system and due to the desired passbands of the quadrature bandpass filters 118, 120, 122, and 124.

More preferably, the center frequencies of the sub-frequency ranges are equally spaced within frequency range 1. For example, the center frequency for the entire multi-coil system could be 21.3 MHz and the frequency spacing between the centers of adjacent coils could be 4,440 Hz. Of course, these ranges could be varied as desired based upon the gradient of the magnetic field, the physical location of each coil in the multi-coil system, or a particular area of interest to be imaged.

FIG. 5(b) shows a frequency domain representation of the frequency shifted MRI signals in frequency range 2, preferably between 13-14 MHz, and more preferably 13.4 MHz. Each MRI signal in channels 1-4 preferably is frequency shifted to the same frequency range 2 shown in FIG. 5(b). For example, dotted lines 508 indicate the frequency translation of the sub-frequency range associated with channel 1 to frequency range 2. Corresponding frequency translations occur for the sub-frequency ranges associated with channels 2, 3, and 4 to frequency range 2. With each channel frequency shifted to an identical frequency range 2, the quadrature bandpass filters 118, 120, 122, and 124 can have equivalent passbands and the generation of control signals by the phase and bandwidth controller 146 is simplified.

The frequency conversion from frequency range 1 to frequency range 2 by the input mixer means and the frequency conversion from frequency range 2 to frequency range 1 by the output mixer means, advantageously prevents spurious interference at the frequencies of the MRI signals in the preferred embodiment, as explained below.

For example, if the quadrature bandpass filters 118, 120, 122, and 124 shown in FIG. 3 directly received the MRI signals in frequency range 1 from the sensing coils of the multi-coil system, the mixing input signals applied to signal mixers 300, 302, 314, and 316 would necessarily be at the center frequencies of the corresponding sensing coils to frequency shift the MRI signal to baseband. The generation of the mixing input signals by the phase and bandwidth controller 146 at or close to the frequencies of the MRI signals of interest would undesirably create the possibility of spurious interference with the MRI signals, such as by leakage of the mixing input signals through the signal mixers 300, 302, 314, and 316. Therefore, the preferred embodiment provides for the frequency conversion, by the input mixer means, from frequency range 1 to frequency range 2, which is substantially displaced from the frequency of the MRI signals of interest. Subsequently the output mixer means perform the frequency conversion from frequency range 2 to frequency range 1.

It should be understood that, although the preferred frequency range 1 is about 21-22 MHz and the preferred frequency range 2 is about 13.4 MHz, frequency range 1 and frequency range 2 may be arbitrarily chosen so long as spurious interference is not created. In fact, frequency range 2 could be chosen to be higher than frequency range 1.

Figure 6:
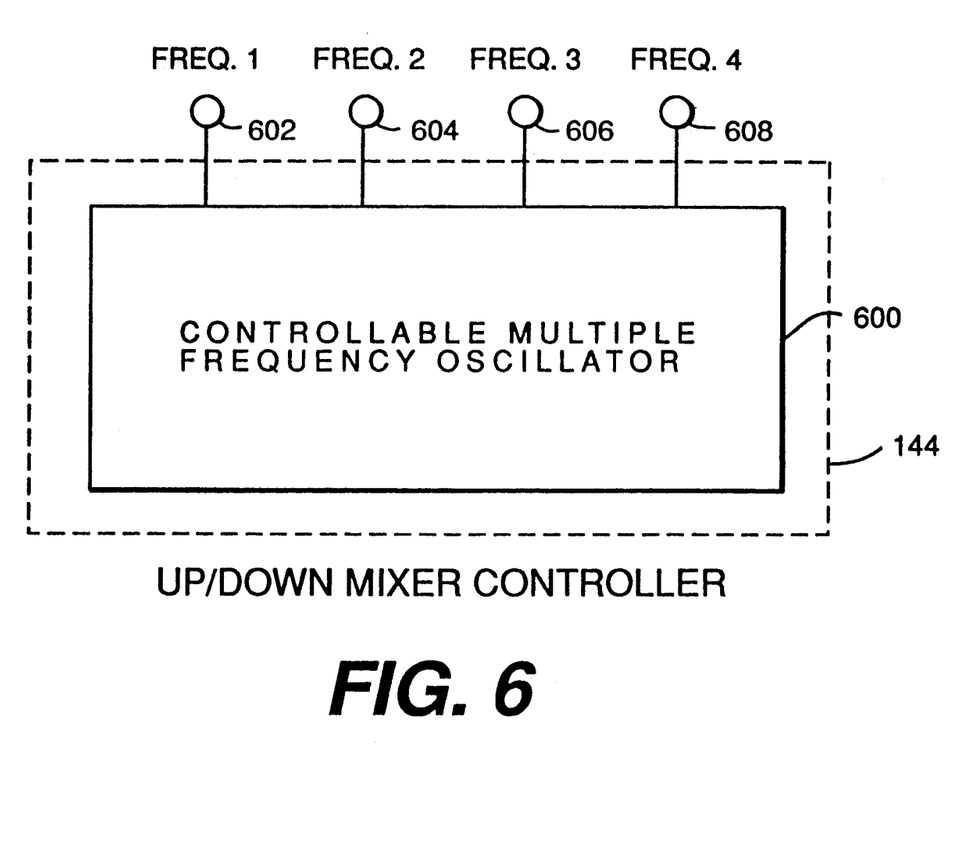
FIG. 6 is a block diagram of an up/down mixer controller shown in FIG. 1.

FIG. 6 illustrates a preferred construction of the up/down mixer controller 144 which includes a controllable multiple frequency oscillator 600 with a plurality of outputs. Controllable multiple frequency oscillator 600 provides several output signals that may be single frequency electrical signals of various frequencies. Frequency 1 is output from a terminal 602, frequency 2 is output from a terminal 604, frequency 3 is output from a terminal 606, and frequency 4 is output from a terminal 608, as shown in FIG. 6. Each frequency from the controllable multiple frequency oscillator 600 is provided to a down mixer and up mixer pair within a single channel.

For example, frequency 1 output from the terminal 602 can be provided to down mixer 102 and up mixer 126, frequency 2 output from the terminal 604 can be provided to down mixer 104 and up mixer 128, et cetera. Providing the same signal to a down mixer and up mixer pair within the same channel ensures that the frequency translation provided by each down mixer and up mixer pair will be exactly equal and opposite and makes the system insensitive to any frequency drift of the controllable multiple frequency oscillator 600 with time or temperature. Because this frequency translation by the down mixer and up mixer in each channel is exactly equal and opposite, the preferred embodiment of the present invention can simply be inserted between a multi-coil sensing system and an existing MRI receiver to produce a video output without further modification.

Furthermore, to achieve the preferred frequency translation of each sub-frequency range within frequency range 1 to the same frequency range 2 in FIG. 5(b), the frequency differences between the various signals output from the controllable multiple frequency oscillator 600 should correspond to the differences between the center frequencies of the adjacent sub-frequency ranges within frequency range 1 (FIG. 5(a)). For example, if the center frequencies of the sub-frequency ranges differ by 10 KHz, the outputs from the controllable multiple frequency oscillators should also differ by 10 KHz.

The preferred embodiment of the present invention further includes filter control means for controlling the bandwidth and phase shift characteristics of the controllable bandpass filter means. As illustrated in FIG. 1, the filter control means is provided as a phase and bandwidth controller 146 connected to each quadrature bandpass filter 118, 120, 122, and 124.

Figure 7A:
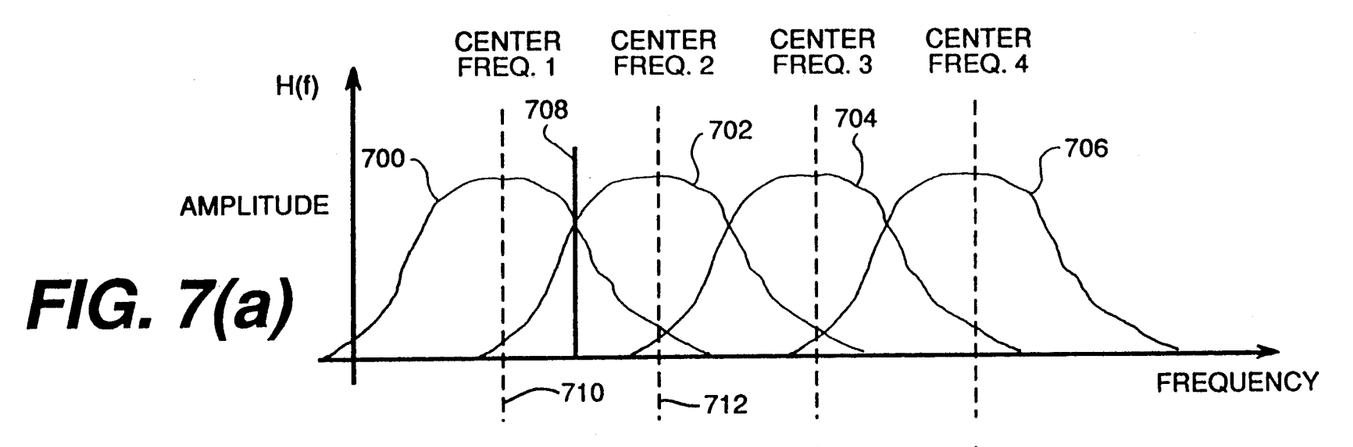
FIG. 7(a) is a graph of the frequency response of four bandpass filters with different center frequencies.

In order to more fully understand the preferred techniques for controlling the bandwidth and phase shift characteristics of the respective quadrature bandpass filters, an explanation of the phase and bandwidth response of each channel of the preferred embodiment shown in FIG. 1 is provided. FIG. 7(a) illustrates the amplitude response for each of the four channels 1-4 shown in FIG. 1. In particular, the amplitude response is shown for a signal input to each quadrature bandpass filter 118, 120, 122, and 124. Each quadrature bandpass filter 118, 120, 122, and 124 has a roughly bell shaped bandpass frequency characteristic 700, 702, 704, and 706, respectively.

Figure 7B:
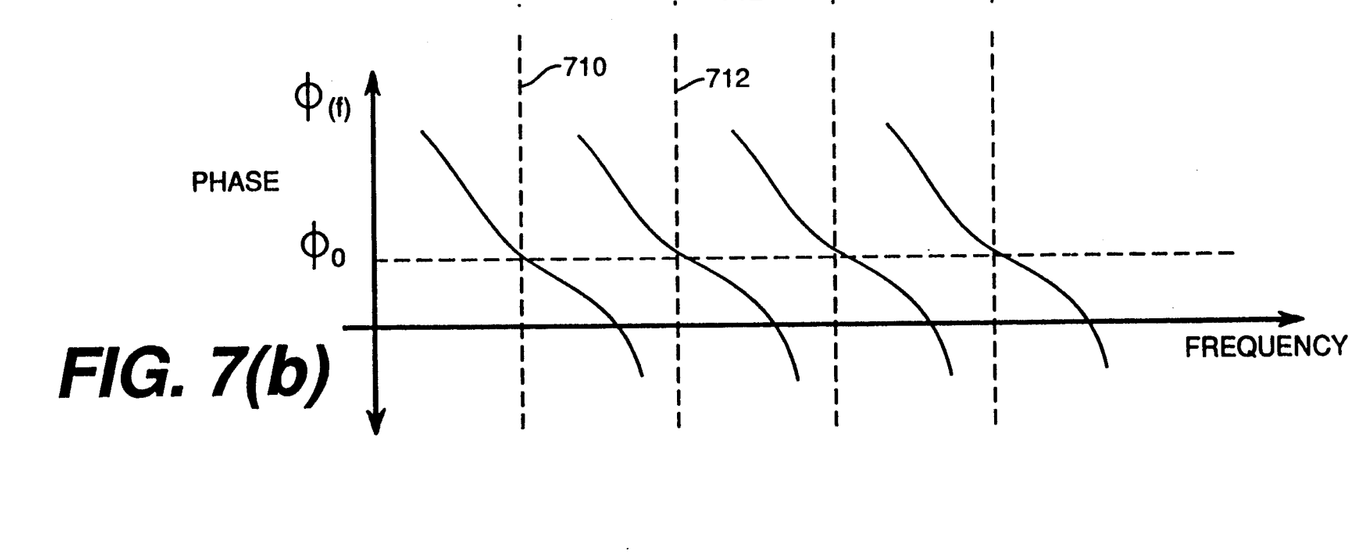
FIG. 7(b) is a graph of the phase response of the four filters in FIG. 7(a).

FIG. 7(b) illustrates the phase shift associated with each quadrature bandpass filter. It should be understood that the amplitudes and phase characteristics illustrated in FIGS. 7(a) and 7(b) are merely exemplary and will vary depending upon filter design. Other amplitude and phase responses could be considered for use in the present invention. FIG. 7(b) discloses a uniform phase shift $\phi_0$ at each center frequency of the quadrature bandpass filters 118, 120, 122, and 124.

As can be seen from FIG. 7(b), a phase problem occurs at the crossover frequency ranges. A crossover frequency range may generally be considered to include frequencies that pass through more than one channel of the apparatus shown in FIG. 1. For example, assuming an MRI signal of interest, shown by solid line 708 in FIG. 7(a), occurs approximately halfway between the first center frequency 710 and the second center frequency 712 in FIG. 7, such a frequency will be passed both by quadrature bandpass filter 118 and by quadrature bandpass filter 120. However, as shown in FIG. 7(b), this MRI signal passing through quadrature bandpass filter 118 will likely have a much different phase shift than the MRI signal passing through bandpass filter 120. Therefore, if the phase difference between the two filter responses is near 180 degrees, destructive interference will occur when these MRI signals are summed by summer 142, resulting in a loss of MRI information and degradation of signal quality.

The phase responses in FIG. 7(b) are monotonic functions of frequency. This is due to the time delay through the filter. Because of causality, the output must happen after the input happens, and not before. If the phase responses of two adjacent-channel filters (for example, quadrature bandpass filters 118 and 120) are identical linear functions of frequency, then the differences between the phase responses of the adjacent channels will be a constant phase angle. Accordingly, if the phase responses only approximate linear functions of frequency, then the phase difference between two adjacent channels will only be approximately constant.

Therefore, the preferred embodiment adjusts the phase shift of the MRI signals passing through the various channels to cause an equivalent phase shift to occur through each adjacent channel at the crossover frequencies.

To achieve the phase shift adjustment in the crossover frequency range, where two adjacent channels contribute roughly equal magnitudes to the final response, various techniques may be considered. For example, controlled time delays, such as delay lines (not shown) could be inserted into the signal path for each channel to change the phase shift of that channel so that adjacent channels have equal phase shifts at a certain frequency in the crossover frequency range. However, the phase shift of a delay line is proportional to frequency. Accordingly, it is difficult to compensate for the approximately constant phase difference between two adjacent channels with a phase change that is a linear function of frequency. Therefore, this approach is not preferred.

Alternately, one could try to choose the type and order of the quadrature bandpass filters 118, 120, 122, and 124 to achieve approximately equal phase shifts in adjacent channel filters in the crossover frequency range. The filter phase functions, an example of which is illustrated in FIG. 7(b), have a strong monotonic change from one side of the passband to the other. Therefore, the phase angle at the lower edge of the higher-frequency filter may be quite different from the phase angle at the upper edge of the lower-frequency filter, since each filter's phase angle is a function only of the arithmetic difference between the frequency and the center frequency of that filter. Therefore, this approach is also not preferred.

Another approach to the above discussed phase shift adjustment is to appropriately inject a controlled constant phase shift into each channel by desirably selecting the control signals provided from the up/down mixer controller 144 to the pairs of down mixers 102, 104, 106, and 108 and up mixers 126, 128, 130, and 132, respectively, for each channel. In particular, the phase shift through the first channel could be controlled by introducing a controlled phase shift between the control signal provided to the signal mixer 204 in down mixer 102 and the control signal provided to a signal mixer (not shown) in up mixer 126 to provide a corresponding phase shift in the MRI signal passing through channel 1, for example. This phase shift is a constant phase angle (with respect to frequency) added to the phase response of the filter.

The preferred approach provides a filter control means including local oscillator means for generating a single frequency signal, phase network means for producing a plurality of phase shifted output signals from the single frequency signal generated by the local oscillator means, and filter oscillator means for generating a signal to control the bandwidth of the controllable bandpass filter means.

Figure 8:
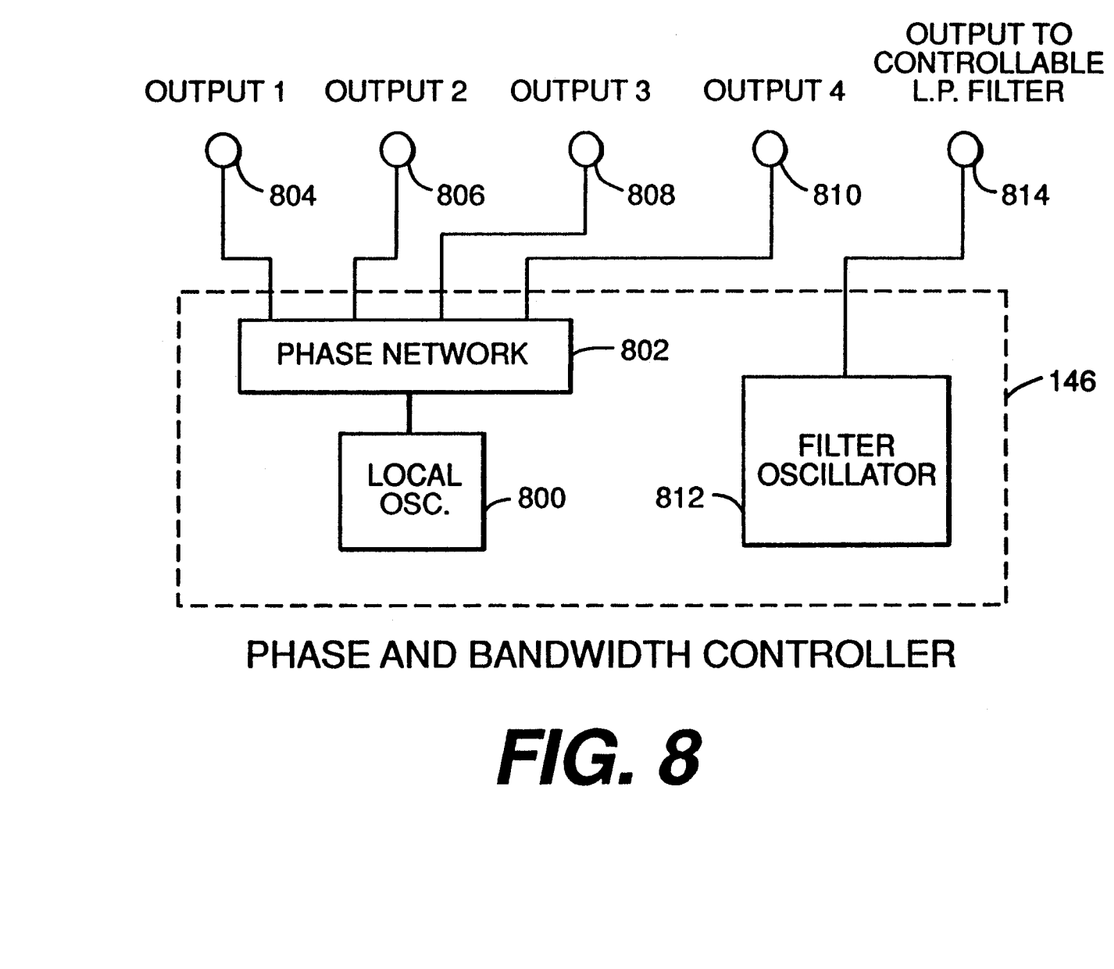
FIG. 8 is a block diagram of a phase and bandwidth controller shown in FIG. 1.

As shown in FIG. 8, the filter control means, provided as phase and bandwidth controller 146, includes a local oscillator 800 connected to a phase network 802. The phase network 802 provides output one at a terminal 804, output two at a terminal 806, output three at a terminal 808, and output four at a terminal 810. Also shown in FIG. 5 is filter oscillator 812 which provides a control signal at a terminal 814 to the controllable lowpass filters 308 and 310 shown in FIG. 3. A preferred phase network 802 may be produced by quadrature hybrid networks or suitable digital frequency dividers, to make the precise 90 degree phase differences, and by delay lines or digital delay circuits to make other desired phase differences by adding a time delay to the constant frequency local oscillator signal.

In the preferred embodiment, the outputs on terminals 804, 806, 808, and 810 from the phase network 802 are provided to the signal mixers 300, 302, 314, and 316 shown in FIG. 3. For example, first output 804 could be provided to the first mixing input 304, second output 806 could be provided to second mixing input 306, third output 808 could be provided to third mixing input 318, and fourth output 810 could be provided to fourth mixing input 320.

Generally, because the preferred quadrature bandpass filters 118, 120, 122, and 124 operate on quadrature principles, the first and second mixing inputs 304 and 306 receive signals that have a 90° phase shift therebetween and the third and fourth mixing inputs 318 and 320 receive signals that have a 90° phase shift therebetween. Therefore, the phase network 802 provides a 90° phase difference between the signals provided to the first mixing input 304 and the second mixing input 306, and a 90° phase difference between the signals provided to the third mixing input 318 and the fourth mixing input 320. The phase shift between mixing inputs 304 and 318 may be chosen independently.

The phase network 802 ca be used to adjust the phase shift created by the quadrature bandpass filters 118, 120, 122, and 124 by adjusting the relative phase shift between the pair of signals input to the first and second mixing input 304 and 306 and the pair of signals input to the third and fourth mixing input 318 and 320. In this way, the phase and bandwidth controller 146 can ensure that the phase shifts are equivalent in the crossover frequency range as shown in the FIG. 7, thereby preventing signal degradation and loss of information.

For example, if a 30° phase difference exists in the crossover frequency range between quadrature bandpass filter 118 and quadrature bandpass filter 120, then it would be desirable to provide a 30° phase shift between the pair of signals input to the first and second mixing input 304 and 306 and the pair of signals input to the third and fourth mixing input 318 and 320 for quadrature bandpass filter 120. For example, a 0° signal could be provided to mixing input 304, a 90° signal could be provided to mixing input 306, a 30° signal could be provided to mixing input 318, and a 120° signal could be provided to mixing input 320.

The filter oscillator 812 shown in FIG. 8 is preferably connected through terminal 814 to terminal 312 shown in FIG. 3 and FIG. 4. The filter oscillator 812 is preferably used to control the bandwidth of the lowpass filter 402 shown in FIG. 4. This bandwidth can be adjusted to obtain a desirable value.

An important parameter is the ratio of the filter bandwidth to the spacing between adjacent channel center frequencies. This parameter is important because a given lowpass filter design (affected by the type of filter and by the number of poles) has a response that is a function of this form: $H = H(f/f_c)$, where f is the frequency variable and $f_c$ is the cutoff frequency parameter of the filter (normally specified at −3 dB, or $$|H(f_c)| = |H(0)| \div \sqrt{2}).$$

Therefore, if the ratio of the cutoff frequency parameter to the spacing between adjacent channel center frequencies df ($f_c$/df) is held constant, as we change df, the magnitude and phase response of the filters will stay the same at the crossover frequency.

To ensure proper phase characteristics in the crossover frequency ranges shown in FIG. 7(a), several design considerations must be addressed. As is well known, the phase characteristics of a filter widely vary with the filter type and order. Furthermore, the phase characteristics of a filter of a given type and order will vary with the selected bandwidth of the filter.

In general, to provide for easy phase equalization between the channels, the filter type and order of the quadrature bandpass filters should be chosen such that the variation of phase shift as a function of frequency is approximately linear in at least the crossover frequency range. This desirably allows for accurate and consistent phase equalization throughout the entire crossover frequency range.

Furthermore, the bandwidth of the quadrature bandpass filters 118, 120, 122, and 124 should generally be chosen to be wider than the channel center frequency spacing and preferably chosen such that the attenuation is less than 0.5 dB in the crossover frequency range to minimize distortion of the spatial response of each channel. However, it should be understood that if the bandwidth is too wide, the noise removal function of the quadrature bandpass filters 118, 120, 122, and 124 will be degraded.

The most preferable phase network 802 produces four signals with a 0°, 90°, 180° and 270° phase shift with respect to the single frequency signal received from the local oscillator means. As embodied herein and shown in FIG. 8, the first output on terminal 804 could be the 0° signal, the second output on terminal 806 could be the 90° signal, the third output on terminal 808 could be the 180° signal, and the fourth output on terminal 810 could be the 270° signal. This most preferred arrangement is desirable because of the ease in which the 0°, 90°, 180° and 270° signals may be generated by the phase network 802.

For example, the most preferable phase network 802 could comprise a digital frequency divider including two flip-flops (not shown) to produce a first signal at terminal 804 and a second signal at terminal 806 with a 90° phase shift. A third signal at terminal 808 with a 180° phase shift and a fourth signal at terminal 810 with a 270° phase shift could be produced by passing the first and second signals through a 180° hybrid power splitter (not shown). The frequency of the phase shifted signals output from the most preferable phase network 802 may be adjusted by mixing the first and second signals with an adjustable frequency signal from a frequency synthesizer (also not shown).

Accordingly, the bandwidth, order, and type of the quadrature bandpass filters 118, 120, 122, and 124 should be designed such that the phase shifts at the center of the crossover frequency range (with respect to the phase angle at each channel's center frequency) are equal to integer multiples of ±45° which would cause the phase difference between two adjacent channels at the center of the crossover frequency range to be a multiple of 90°. In this case, the 0°, 90°, 180° and 270° signals generated by the most preferred phase network 802 can be variously applied to the quadrature bandpass filters 118, 120, 122, and 124 to appropriately equalize the phase shifts of the various channels.

For example, the following results were obtained for two cases if third-order Butterworth lowpass filters are used as the lowpass filter 402 shown in FIG. 4:

| Case no. | $f_c$/df ratio | Attenuation at crossover | Phase shift at crossover | Phase difference between channels |
|---|---|---|---|---|
| 1 | 0.71 | 0.52 dB | 90° | 180° |
| 2 | 1.31 | 0.014 dB | 45° | 90° | wherein $f_c$ is the 3 dB cutoff frequency of the third-order Butterworth lowpass filters and df is the difference between the center frequencies of adjacent channels.

The filter in the second case has wider bandwidth than the first case, and accordingly has a reduced ability to block noise. However, the attenuation at crossover is very low for the second case and the total response of the MRI signal processing apparatus is very flat.

In view of the above disclosure, it will be appreciated that these teachings may have applicability outside of the MRI art. In particular, the teachings of the present invention may be useful in any situation where the filtering and subsequent combination of a plurality of channels is desired. Also, it will be appreciated that various desirable methods of signal processing are also disclosed.

It will be apparent to those skilled in the art that various modifications and variations can be made in the MRI signal processing apparatus and methods of the present invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An MRI signal processing apparatus for providing a low noise output signal including a plurality of input channels for receiving a plurality of MRI signals, each MRI signal originating from a sensing coil which produces an MRI signal in a first frequency range, comprising:

input mixer means for frequency shifting each of the plurality of MRI signal from the first frequency range to a second frequency range;

controllable bandpass filter means coupled to the input mixer means for bandpass filtering each of the plurality of frequency shifted MRI signals;

output mixer means for frequency shifting each MRI signal output from the controllable bandpass filter means from the second frequency range to the first frequency range;

summing means for combining the frequency shifted signals output from the output mixer means to produce the low noise output signal;

mixer control means for controlling the respective frequency shifts of the input mixer means and the output mixer means; and filter control means for controlling bandwidth and phase shift characteristics of the controllable bandpass filter means.

2. The apparatus of claim 1, wherein the input mixer means comprises bandpass filter means for removing unwanted frequencies.

3. The apparatus of claim 1, wherein the output mixer means comprises a bandpass filter means for removing unwanted frequencies.

4. The apparatus of claim 1, wherein the input mixer means further comprises:
band pass filter means for passing a wide range of frequencies; and
signal mixer means for mixing a signal from the first buffer amplifier means with a signal from the mixer control means.

5. The apparatus of claim 4, wherein the input mixer means further comprises:
first buffer amplifier means coupled to the band pass filter means; and
second buffer amplifier means coupled to the output of the signal mixer means.

6. The apparatus of claim 1, wherein the input mixer means comprises a plurality of signal mixer means for respectively mixing the MRI signals of the plurality of input channels with a signal from the mixer control means to produce a plurality of MRI output signals in the second frequency range.

7. The apparatus of claim 6, wherein each MRI signal is in a desired adjacent sub frequency range within the first frequency range and wherein each MRI signal is frequency shifted by a corresponding one of the plurality of signal mixer means to the second frequency range.

8. The apparatus of claim 1, wherein the controllable bandpass filter means comprises a plurality of bandpass filters for respectively receiving the MRI signals of the plurality of input channels.

9. The apparatus of claim 8, wherein each bandpass filter has the second frequency range as a passband.

10. The apparatus of claim 1, wherein the controllable bandpass filter means comprises a plurality of quadrature bandpass filters for respectively receiving the frequency shifted MRI signals received from the input mixer means.

11. The apparatus of claim 10, wherein each quadrature bandpass filter comprises:
a pair of input signal mixers for down mixing the MRI signal to a baseband frequency range;
a pair of controllable lowpass filters coupled to the pair of input signal mixers; and
a pair of output signal mixers for up mixing a signal from a baseband frequency range to the frequency range of the frequency shifted MRI signals received from the input mixer means.

12. The apparatus of claim 11, wherein each quadrature bandpass filter further comprises a bandpass filter, coupled to the pair of output signal mixers, for removing unwanted frequencies from the output of the output signal mixers.

13. The apparatus of claim 11, wherein the pair of input signal mixers receives a first and a second mixing signal and the pair of output signal mixers receives a third and a fourth mixing signal, the first and second mixing signals having a desired first phase difference therebetween and the third and fourth mixing signals having the same desired first phase difference therebetween.

14. The apparatus of claim 13, wherein the desired first phase difference is 90 degrees.

15. The apparatus of claim 13, wherein the first and third mixing signals have a desired second phase difference therebetween and the second and fourth mixing signals having the same desired second phase difference therebetween, the second phase difference being selected to control an overall phase shift of each quadrature bandpass filter.

16. The apparatus of claim 15, wherein the desired second phase difference is 90 degrees.

17. The apparatus of claim 11, wherein each of the controllable lowpass filters includes a switched capacitor lowpass filter which is controlled by a signal with a variable clock frequency from the filter control means.

18. The apparatus of claim 11, wherein each of the controllable lowpass filters comprises:
an anti-aliasing filter; and
a lowpass filter.

19. The apparatus of claim 11, wherein each of the controllable lowpass filters comprises:
a lowpass filter; and
an active high pass filter.

20. The apparatus of claim 1, wherein the output mixer means comprises a plurality of signal mixer means for mixing the plurality of bandpass filtered signals from the controllable bandpass filter means with a signal from the mixer control means to produce a plurality of MRI output signals in the first frequency range.

21. The apparatus of claim 1, wherein the input mixer means and the output mixer means receive identical signals from the mixer control means to provide exactly opposite frequency shift upon input mixing and output mixing, respectively.

22. The apparatus of claim 1, wherein the summing means includes a summing amplifier which adds a plurality of MRI output signals from the output mixing means.

23. The apparatus of claim 1, wherein the filter control means comprises:
local oscillator means for generating a single frequency signal;
phase network means coupled to the controllable bandpass filter means for producing a plurality of phase shifted output signals from the single frequency signal generated by the local oscillator means; and
filter oscillator means for generating a signal to control a bandwidth of the controllable bandpass filter means.

24. The apparatus of claim 23, wherein the phase network means produces four signals at the same frequency from the single frequency signal from the local oscillator means, and wherein the four signals have phase angles of 0°, 90°, 180°, and 270° with respect to each other.

25. The apparatus of claim 1, wherein the mixer control means comprises a controllable multiple frequency oscillator which provides a plurality of output frequencies to the input mixer means and output mixer means.

26. The apparatus of claim 25, wherein the plurality of frequencies output from the controllable multiple frequency oscillator are regularly spaced in a desired frequency range.

27. An MRI signal processing apparatus for providing a low noise output signal including a plurality of input channels for receiving a plurality of MRI signals, each MRI signal originating from a sensing coil, comprising:
quadrature bandpass filter means for bandpass filtering each MRI signal to remove unwanted noise from the MRI signal, the quadrature bandpass filter means including a plurality of quadrature bandpass filters, each filter including:

a pair of input signal mixers for down mixing the MRI signal to a baseband frequency range;

a pair of controllable lowpass filters coupled to the pair of input signal mixers;

a pair of output signal mixers for up mixing a signal from a baseband frequency range to a frequency range of the MRI signal inputted to the pair of input signal mixers;

summing means for combining the filtered MRI signals outputted by the quadrature bandpass filter means to produce the low noise output signal; and filter control means for controlling bandwidth and phase shift characteristics of the quadrature bandpass filter means, the filter control means including local oscillator means for generating a single frequency signal and phase network means for producing a plurality of phase shifted output signals from the single frequency signal to control the phase shift of the quadrature bandpass filters.

28. A method for processing a plurality of MRI signals to provide a low noise output signal including a plurality of input channels for receiving the plurality of MRI signals, each MRI signal originating from a sensing coil which produces the MRI signal in a first frequency range, comprising the steps of:

frequency shifting each of the plurality of MRI signals from the first frequency range to a second frequency range;

bandpass filtering each frequency shifted MRI signal to remove unwanted noise from the MRI signal;

frequency shifting each bandpass filtered MRI signal from the second frequency range to the first frequency range; and combining the MRI signals frequency shifted to the first frequency range to produce the low noise output signal.

29. A method for processing a plurality of MRI signals to provide a low noise output signal including a plurality of input channels, each input channel originating from a sensing coil which produces an MRI signal, comprising the steps of:

bandpass filtering each of the plurality of MRI signal to remove unwanted noise from the MRI signal, the bandpass filtering step including the substeps of:

down mixing each MRI signal to a baseband frequency range to produce first and second signals in phase quadrature;

lowpass filtering the first and second signals to remove unwanted noise therefrom; and up mixing and recombining the lowpass filtered first and second signals to produce a filtered signal; and combining the plurality of filtered signals to produce the low noise output signal.

* * * * *